United States Patent
Tsai et al.

(10) Patent No.: US 11,855,639 B2
(45) Date of Patent: Dec. 26, 2023

(54) SLEW RATE CONTROL DEVICE AND SLEW RATE CONTROL METHOD

(71) Applicant: REALTEK SEMICONDUCTOR CORP., Hsinchu (TW)

(72) Inventors: Tsung-Han Tsai, Hsinchu (TW); Peng-Fei Lin, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/954,454

(22) Filed: Sep. 28, 2022

(65) Prior Publication Data

US 2023/0102952 A1 Mar. 30, 2023

(30) Foreign Application Priority Data

Sep. 30, 2021 (TW) .................................. 110136368

(51) Int. Cl.
*H03K 5/05* (2006.01)
*H03K 5/24* (2006.01)

(52) U.S. Cl.
CPC .................. *H03K 5/05* (2013.01); *H03K 5/24* (2013.01)

(58) Field of Classification Search
CPC ............... H03K 5/24; H03K 5/05; H03K 5/12
USPC ........................................................ 327/170
See application file for complete search history.

(56) References Cited

U.S. PATENT DOCUMENTS

| 6,225,844 B1 * | 5/2001 | Fujiwara .......... H03K 19/00361 |
| | | 327/437 |
| 6,362,672 B1 | 3/2002 | Geist |
| 2004/0107230 A1 * | 6/2004 | Bardouillet .............. H03K 3/84 |
| | | 708/252 |

FOREIGN PATENT DOCUMENTS

EP 2894534 A1 7/2015

* cited by examiner

*Primary Examiner* — Quan Tra
(74) *Attorney, Agent, or Firm* — Li & Cai Intellectual Property (USA) Office

(57) ABSTRACT

A slew rate control device and a slew rate control method are provided. The slew rate control device includes a signal generating circuit, a comparator circuit, and a control circuit. The signal generating circuit generates a first voltage signal and a second voltage signal having a slew rate, and the first voltage signal and the second voltage signal are a pair of differential signals. The comparator circuit outputs an enabling signal according to a relative positional relationship between an eye crossing point of the pair of differential signals and a signal edge of a reference clock. The control circuit generates at least one control signal according to the enabling signal to control the signal generating circuit, such that the signal generating circuit changes the slew rate of the first voltage signal and the second voltage signal according to the at least one control signal.

16 Claims, 6 Drawing Sheets

SLEW RATE CONTROL DEVICE AND SLEW RATE CONTROL METHOD

CROSS-REFERENCE TO RELATED PATENT APPLICATION

This application claims the benefit of priority to Taiwan Patent Application No. 110136368, filed on Sep. 30, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a slew rate control device and a slew rate control method, and more particularly to a slew rate control device and a slew rate control method that can change a slew rate according to a relative positional relationship between an eye crossing point of a pair of differential signals and a signal edge of a reference clock.

BACKGROUND OF THE DISCLOSURE

Slew rate refers to a voltage variation per unit time, and can be intuitively divided into a rising edge slew rate and a falling edge slew rate. However, in the control of the slew rate, a complex circuit is usually required for detection of the slew rate, and a voltage source or a current source with adjustable output capability is also required to be provided for changing of the slew rate.

SUMMARY OF THE DISCLOSURE

In response to the above-referenced technical inadequacies, the present disclosure provides a slew rate control device, which includes a signal generation circuit, a comparison circuit, and a control circuit. The signal generating circuit is configured to generate a first voltage signal and a second voltage signal having a slew rate, and the first voltage signal and the second voltage signal are a pair of differential signals. The comparator circuit is configured to output an enabling signal according to a relative positional relationship between an eye crossing point of the pair of differential signals and a signal edge of a reference clock. The control circuit is coupled between the signal generating circuit and the comparator circuit, and is configured to generate at least one control signal according to the enabling signal to control the signal generating circuit, such that the signal generating circuit is configured to, according to the at least one control signal, change the slew rate of the first voltage signal and the second voltage signal.

In addition, an embodiment of the present disclosure provides a slew rate control method, which is applicable to a slew rate control device, and includes the following steps. First, a signal generating circuit is configured to generate a first voltage signal and a second voltage signal having a slew rate, and the first voltage signal and the second voltage signal are a pair of differential signals. Next, a comparator circuit is configured to output an enabling signal according to a relative positional relationship between an eye crossing point of the pair of differential signals and a signal edge of a reference clock. Next, a control circuit is configured to generate at least one control signal according to the enabling signal to control the signal generating circuit, such that the signal generating circuit is configured to, according to the at least one control signal, change the slew rate of the first voltage signal and the second voltage signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
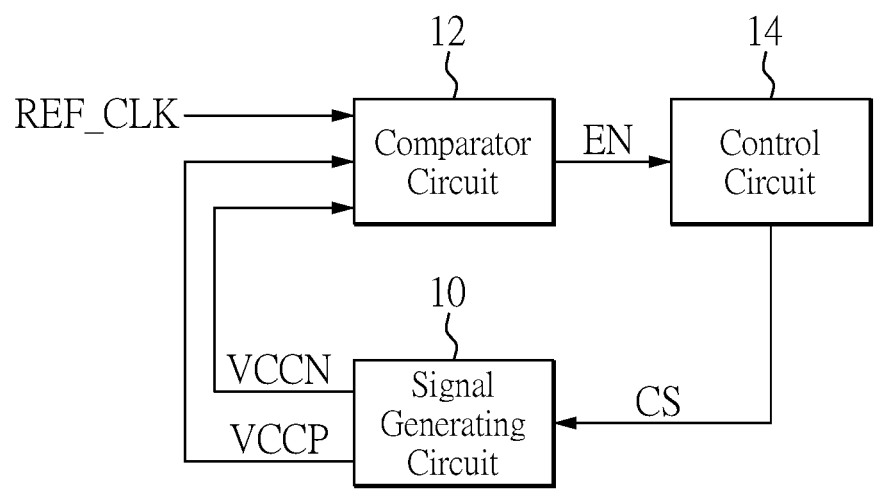
FIG. 1 is a functional block diagram of a slew rate control device according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, which is a functional block diagram of a slew rate control device according to one embodiment of the present disclosure. As shown in FIG. 1, the slew rate control device 1 includes a signal generation circuit 10, a comparator circuit 12 and a control circuit 14. The control circuit 14 is coupled between the comparator circuit 12 and the signal generating circuit 10. The signal generating circuit 10 is configured to generate a first voltage signal VCCP and a second voltage signal VCCN having a slew rate, and the first voltage signal VCCP and the second voltage signal VCCN are a pair of differential signals. That is, when the first voltage signal VCCP transitions from a logic high level to a logic low level, the second voltage signal VCCN transitions from a logic low level to a logic high level, and a falling edge slew rate of the first voltage signal VCCP is equal to a rising edge slew rate of the second voltage signal VCCN at this time. Conversely, when the first voltage signal VCCP transitions from the logic low level to the logic high level, the second voltage signal VCCN transitions from the logic high level to the logic low level, and a rising edge slew rate of the first voltage signal VCCP is equal to a falling edge slew rate of the second voltage signal VCCN at this time.

Figure 2:
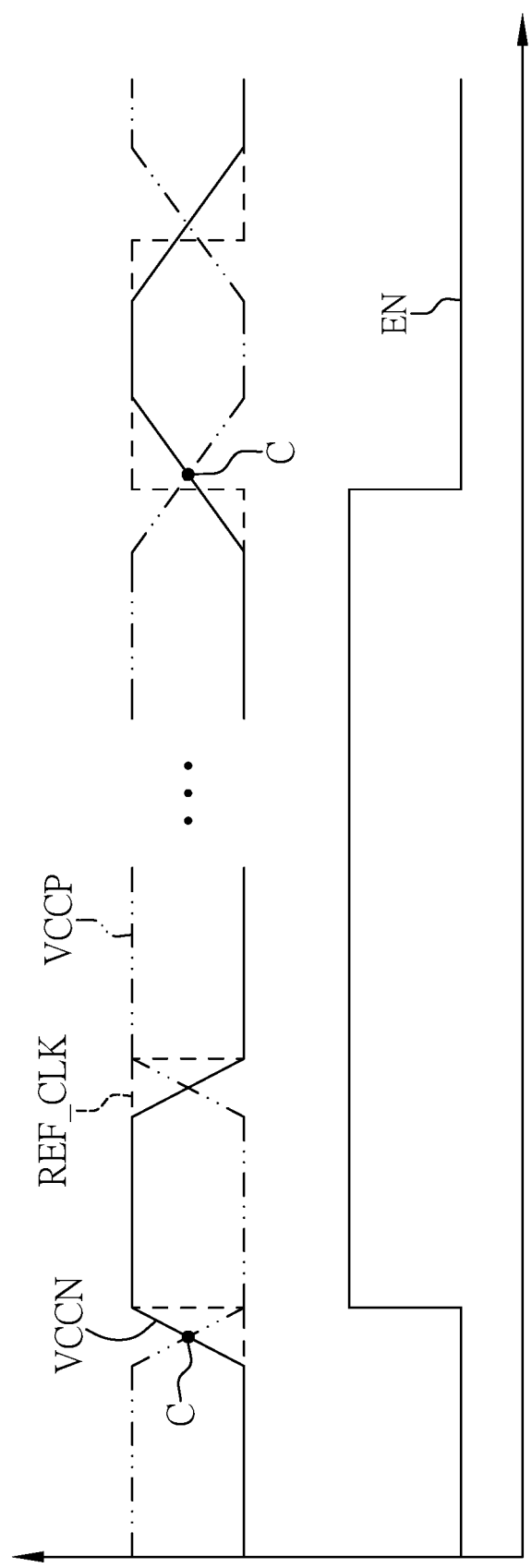
FIG. 2 is a schematic time sequence diagram of a first voltage signal, a second voltage signal, a reference clock and an enabling signal according to one embodiment of the present disclosure.

Referring to FIG. 2, which is a schematic time sequence diagram of a first voltage signal, a second voltage signal, a reference clock and an enabling signal according to one embodiment of the present disclosure. As shown in FIG. 2, in one embodiment of the present disclosure, the first voltage signal VCCP generated by the signal generating circuit 10 is exemplified as being at a logic high level, while the reference clock REF_CLK at this time is at a logic low level. Therefore, an eye crossing point C of the pair of differential signals (i.e., the first voltage signal VCCP and the second voltage signal VCCN) can be, for example, an intersection of a falling edge of the first voltage signal VCCP and a rising edge of the second voltage signal VCCN, but the present disclosure is not limited thereto. In this case, in response to the comparison circuit 12 determining that the eye crossing point C appears on the left side of the rising edge of the reference clock REF_CLK, the comparator circuit 12 outputs an enabling signal EN with a logic high level, and the control circuit 14 generates at least one control signal CS to control the signal generating circuit 10 according to the enabling signal EN with the logic high level, such that the signal generating circuit 10 can change the slew rate of the first voltage signal VCCP and the second voltage signal VCCN according to the at least one control signal CS.

It can be seen from FIG. 2 that at this time, the control circuit 14 is configured to generate at least one control signal CS to control the signal generation circuit 10 to reduce the slew rate of the first voltage signal VCCP and the second voltage signal VCCN, such that the eye crossing point C is adjusted to the right side of the rising edge of the reference clock REF_CLK. Therefore, in response to the comparator circuit 12 determining that the eye crossing point C appears on the right side of the rising edge of the reference clock REF_CLK, the comparator circuit 12 outputs the enabling signal EN with a logic low level. It should be noted that, the implementation of the comparison circuit 12 is described above through a specific embodiment, but the present disclosure is not limited thereto. To sum up, the comparator circuit 12 can be configured to output the enabling signal EN according to a relative positional relationship between an eye crossing point of the pair of differential signals (i.e., the first voltage signal VCCP and the second voltage signal VCCN) and a signal edge of the reference clock REF_CLK. Furthermore, the control circuit 14 is configured to generate at least one control signal CS according to the enabling signal EN to control the signal generating circuit 10, such that the signal generating circuit 10 can be configured to, according to the at least one control signal CS, change the slew rate of the first voltage signal VCCP and the second voltage signal VCCN.

Figure 3:
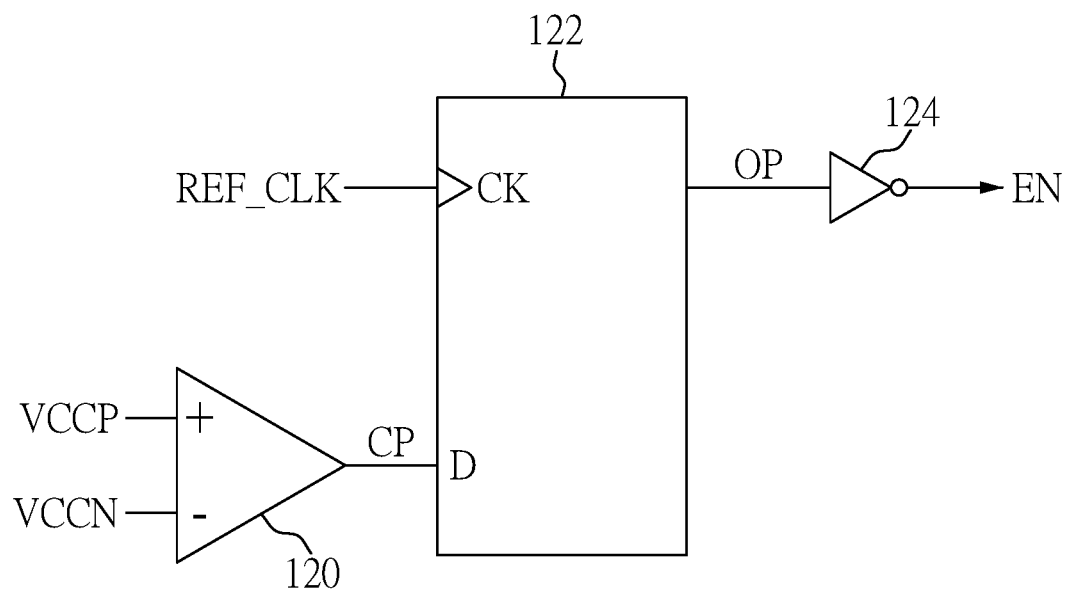
FIG. 3 is a schematic circuit diagram of a comparator circuit according to one embodiment of the present disclosure.

For a better understanding of the comparator circuit 12, an implementation of the comparator circuit 12 used in FIG. 2 is illustrated in the following descriptions by using a specific circuit, but the present disclosure is not limited thereto. Reference is made to FIG. 3, which is a schematic circuit diagram of a comparator circuit according to one embodiment of the present disclosure. As shown in FIG. 3, the comparator circuit 12 can include an operational amplifier 120, a flip-flop 122 and an inverter 124. The operational amplifier 120 is configured to receive the first voltage signal VCCP and the second voltage signal VCCN and output a comparison signal CP. Taking the embodiment of FIG. 2 as an example, a non-inverting input terminal and an inverting input terminal of the operational amplifier 120 respectively receive the first voltage signal VCCP and the second voltage signal VCCN, and in response to the first voltage signal VCCP being smaller than the second voltage signal VCCN, an output terminal of the operational amplifier 120 outputs the comparison signal CP with a logic low level. That is, in response to an emergence of the eye crossing point C in FIG. 2, the operational amplifier 120 outputs the comparison signal CP at the logic low level until the first voltage signal VCCP is greater than the second voltage signal VCCN again.

A data input terminal D and a clock input terminal CK of the flip-flop 122 respectively receive the comparison signal CP and the reference clock REF_CLK, and in response to the reference clock REF_CLK changing from a logic low level to a logic high level, the flip-flop 122 outputs an output signal OP that is equal to the comparison signal CP. That is, in response to the eye crossing point C of FIG. 2 appearing on the left side of the rising edge of the reference clock REF_CLK, the output signal OP at this time is equal to the comparison signal CP of the logic low level. In addition, the inverter 124 is coupled to the flip-flop 122 and configured to receive and invert the output signal OP, and output the inverted output signal OP taken as the enabling signal EN. Therefore, in response to the output signal OP being equal to the comparison signal CP at the logic low level, the comparator circuit 12 outputs the enabling signal EN with the logic high level, and the control circuit 14 can then generate the at least one control signal CS to control the signal generating circuit 10 according to the enabling signal EN with the logic high level, such that the signal generating circuit 10 can change the slew rate of the first voltage signal VCCP and the second voltage signal VCCN according to the at least one control signal CS. Since operational principles of the operational amplifier 120, the flip-flop 122 and the inverter 124 are known to those skilled in the art, details pertaining thereto are omitted hereinafter.

Figure 4:
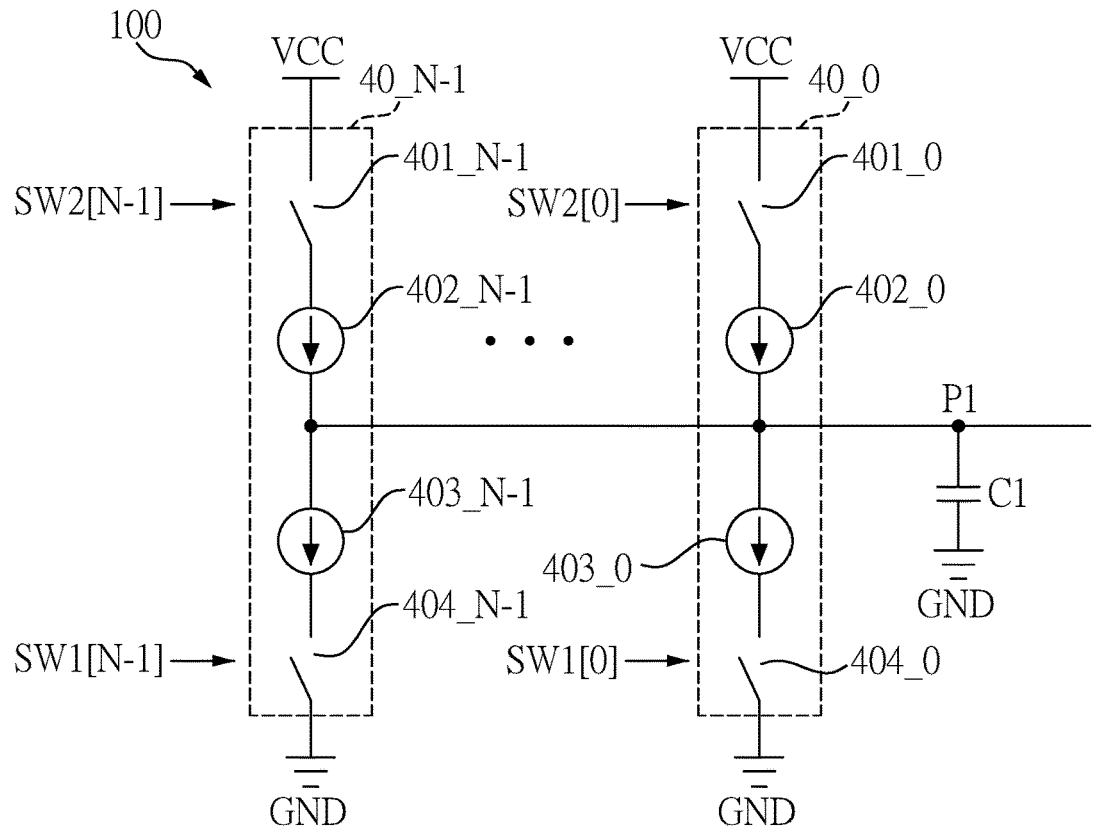
FIG. 4 is a schematic circuit diagram of a signal generating circuit according to one embodiment of the present disclosure.
Figure 4:
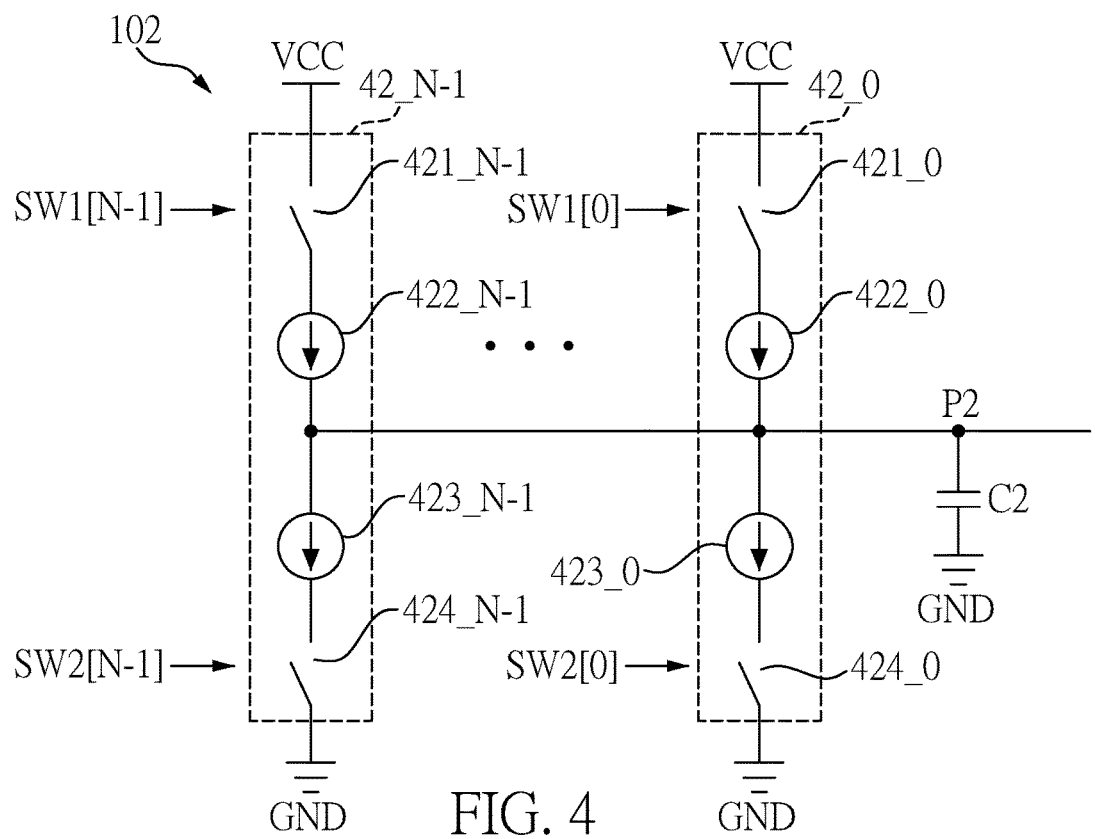

On the other hand, reference is made to FIG. 4, which is a schematic circuit diagram of a signal generating circuit 10 according to one embodiment of the present disclosure. As shown in FIG. 4, the signal generating circuit 10 can include a phase interpolator 100 and a phase interpolator 102 configured to output the first voltage signal VCCP and the second voltage signal VCCN through a node P1 and a node P2, respectively, and the phase interpolator 100 and phase interpolator 102 each include a plurality of circuit branches. In this embodiment, the phase interpolator 100 includes circuit branches 40_0 to 40_N−1, and the phase interpolator 102 includes circuit branches 42_0 to 42_N−1, where N is an integer greater than 1, but the present disclosure does not limit a specific value of N. In addition, in the first phase interpolator 100 or the second phase interpolator 102, each of the plurality of circuit branches includes a first switch, a first current source, a second current source and a second switch connected in series between a supply voltage VCC and a ground voltage GND, and the node P1 or the node P2 is coupled between the first current source and the second current source.

For example, the circuit branch 40_0 of the phase interpolator 100 includes a first switch 401_0, a first current source 402_0, a second current source 403_0 and a second switch 404_0 connected in series between the supply voltage VCC and the ground voltage GND, and the node P1 is coupled between the first current source 402_0 and the second current source 403_0, and so forth, the circuit branch 40_N−1 of the phase interpolator 100 includes a first switch 401_N−1, a first current source 402_N−1, a second current source 403_N−1 and a second switch 404_N−1, and the node P1 is coupled between the first current source 402_N−1 and the second current source 403_N−1. In contrast, the circuit branch 42_0 of the phase interpolator 102 includes a first switch 421_0, a first current source 422_0, a second current source 423_0 and a second switch 424_0 connected in series between the supply voltage VCC and the ground voltage GND, and the node P2 is coupled between the first current source 422_0 and the second current source 423_0, and so forth, the circuit branch 42_N−1 of the phase interpolator 102 includes a first switch 421_N−1, a first current source 422_N−1, a second current source 423_N−1 and a second switch 424_N−1, and the node P2 is coupled between the first current source 422_N−1 and the second current source 423_N−1.

In this embodiment, the phase interpolator 100 can further include a capacitor C1 coupled between the node P1 and the ground voltage GND, and the phase interpolator 102 can further include a capacitor C2 coupled between the node P2 and the ground voltage GND. In this case, the phase interpolator 100 can discharge the capacitor C1 with the second current sources 403_0 to 403_N−1 through the second switches 404_0 to 404_N−1 that are turned on, such that the first voltage signal VCCP transitions from a logic high level to a logic low level. Simultaneously, the phase interpolator 102 can use the first current sources 422_0 to 422_N−1 to charge the capacitor C2 through the first switches 421_0 to 421_N−1 that are turned on, such that the second voltage signal VCCN transitions from a logic low level to a logic high level. If capacitances of the capacitors are equal and the current sources provides the same amount of current, since the falling edge slew rate of the first voltage signal VCCP is equal to the rising edge slew rate of the second voltage signal VCCN, the at least one control signal CS generated by the control circuit 14 can include a first control signal SW1[N−1:0] of N-bits for controlling the second switches 404_0 to 404_N−1 and the first switches 421_0 to 421_N−1. For example, a first bit SW1[0] of the first control signal is used to control the second switch 404_0 and the first switch 421_0, and so forth, an N-th bit SW1[N-0] of the first control signal is used to control the second switch 404_N−1 and the first switch 421_N−1.

The phase interpolator 100 can use the first current sources 402_0 to 402_N−1 to charge the capacitor C1 through the first switches 401_0 to 401_N−1 that are turned on, such that the first voltage signal VCCP transitions from a logic low level to a logic high level. At the same time, the phase interpolator 102 can also use the second current sources 423_0 to 423_N−1 to discharge the capacitor C2 through the second switches 424_0 to 424_N−1 that are turned on, such that the second voltage signal VCCN transitions from a logic high level to a logic high level. If capacitances of the capacitors are equal and the current sources provides the same amount of current, since the rising edge slew rate of the first voltage signal VCCP is equal to the falling edge slew rate of the second voltage signal VCCN, the at least one control signal CS generated by the control circuit 14 can include a second control signal SW2[N−1:0] of N-bits for controlling the first switches 401_0 to 401_N−1 and the second switches 424_0 to 424_N−1. For example, a first bit SW2[0] of the second control signal is used to control the first switch 401_0 and the second switch 424_0, and so forth, an N-th bit SW2[N-0] of the second control signal is used to control the first switch 401_N−1 and the second switch 424_N−1.

It can be seen that, if the falling edge slew rate of the first voltage signal VCCP need to be lowered, the control circuit 14 can reduce the number of the second switches 404_0 to 404_N−1 that are turned on in the phase interpolator 100, such that an efficiency of discharging the capacitor C1 is deteriorated. Simultaneously, the control circuit 14 can also reduce the number of the first switches 421_0 to 421_N−1 that are turned on in the phase interpolator 102, such that an efficiency of charging the capacitor C2 is deteriorated, thereby reducing the rising edge slew rate of the second voltage signal VCCN. In addition, if the rising edge slew rate of the first voltage signal VCCP needs to be lowered, the control circuit 14 can reduce the number of the first switches 401_0 to 401_N−1 that are turned on in the phase interpolator 100, such that the efficiency of charging the capacitor C1 is deteriorated. Simultaneously, the control circuit 14 can also reduce the number of the second switches 424_0 to 424_N−1 that are turned on in the phase interpolator 102, such that the efficiency of discharging the capacitor C2 is deteriorated, thereby reducing the falling edge slew rate of the second voltage signal VCCN. Therefore, compared with the existing manner for providing voltage sources or current sources with adjustable output capability to change the slew rate, in the slew rate control device 1 of the present disclosure, the number of switches that are turned on in each phase interpolator can be intuitively controlled to change the slew rate.

Figure 5:
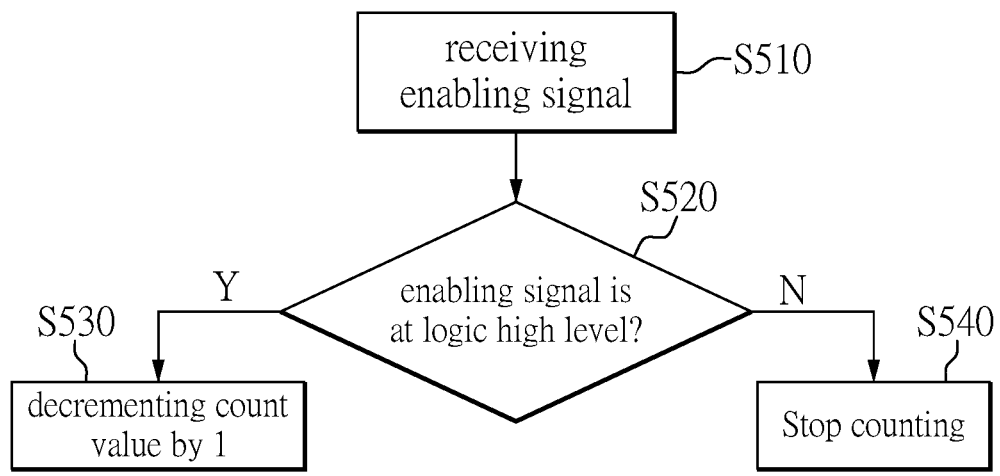
FIG. 5 is a flow chart showing that the control circuit counts the enabling signal according to the enabling signal according to one embodiment of the present disclosure.

In this case, the control circuit 14 can be further configured to count the enabling signal EN to generate a count value CV (not shown in FIG. 1 to FIG. 4), and the count value CV is used to represent the number of switches that are controlled by the control circuit 14 to be turned on in each phase interpolator, but the present disclosure does not limit a specific implementation therefor, such that the control circuit 14 can also generate the first control signal SW1[N−1:0] and the second control signal SW2[N−1:0] according to the count value CV. For ease of illustration, the count value CV can be represented by N bits in the present disclosure, and the number of bits with a value of 1 represents the number of switches to be turned on in each phase interpolator. Therefore, in the above embodiment, the N bits of the count value CV are all initially 1. In addition, the implementation of the control circuit 14 used in FIG. 2 for generating the count value CV is described hereinafter through a specific embodiment, but the present disclosure is not limited thereto. Reference is made to FIG. 5, which is a flow chart showing that the control circuit counts the enabling signal according to the enabling signal according to one embodiment of the present disclosure. As shown in FIG. 5, in step S510, the control circuit 14 receives the enabling signal EN, and in step S520, whether or not the enabling signal EN is at a logic high level is determined.

In response to the enabling signal EN being at the logic high level, the eye crossing point C of FIG. 2 appears on the left of the rising edge of the reference clock REF_CLK, such that the control circuit 14 can execute step S530 to decrement the count value CV by 1. That is to say, the control circuit 14 reduces the number of switches that are turned on to lower the slew rate of the first voltage signal VCCP and the second voltage signal VCCN, thereby making the eye crossing point C appear to the right of the rising edge of the reference clock REF_CLK. If not, the eye crossing point C of FIG. 2 appears on the right side of the rising edge of the reference clock REF_CLK, such that the control circuit 14 can execute step S540 to stop counting. Since the relevant details are the same as the above-mentioned contents, repeated descriptions are omitted hereinafter. Finally, reference is made to FIG. 6, which is a flow chart of a slew rate control method according to one embodiment of the present disclosure. Since slew rate control method of FIG. 6 can be applied to the slew rate control device 1 of FIG. 1, reference can be further made to FIG. 1 in conjunction with FIG. 6 to facilitate better understanding.

Figure 6:
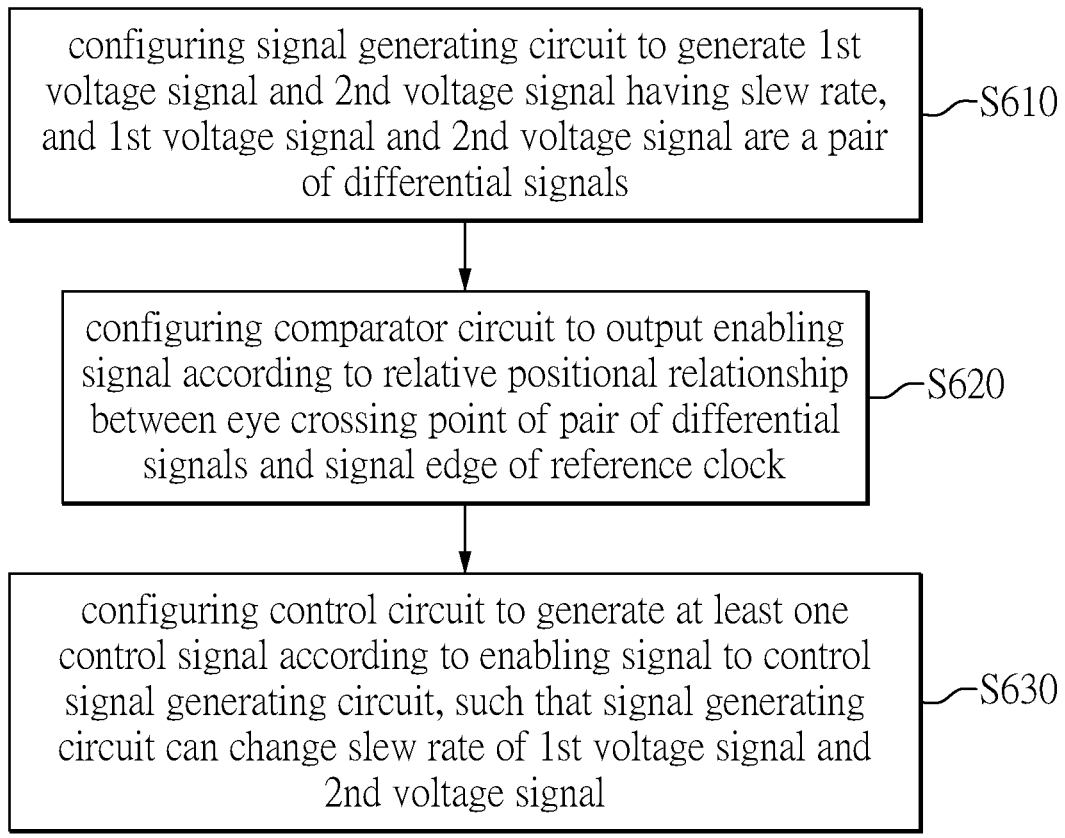
FIG. 6 is a flow chart of a slew rate control method according to one embodiment of the present disclosure.

As shown in FIG. 6, in step S610, the signal generating circuit 10 is configured to generate the first voltage signal VCCP and the second voltage signal VCCN having a slew rate, and the first voltage signal VCCP and the second voltage signal VCCN are a pair of differential signals. Next, in step S620, the comparator circuit 12 is configured to output the enabling signal EN according to a relative positional relationship between the eye crossing point C of the pair of differential signals and a signal edge of the reference clock REF_CLK. Next, in step S630, the control circuit 14 is configured to generate at least one control signal CS according to the enabling signal EN to control the signal generating circuit 10, such that the signal generating circuit 10 can change the slew rate of the first voltage signal VCCP and the second voltage signal VCCN. Since the relevant details have already been described in the content above, further descriptions thereof are omitted herein.

In conclusion, in the slew rate control device and the slew rate control method provided by the present disclosure, the slew rate can be changed according to a relative positional relationship between an eye crossing point of a pair of differential signals and a signal edge of a reference clock. In addition, in the slew rate control device of the present disclosure, two phase interpolators can be used to respectively generate one voltage signal in the pair of differential signals, and each phase interpolator can use a current source to charge or discharge a capacitor through switches that are turned on, such that the corresponding voltage signal can transition from a logic low level to a logic high level or from a logic high level to a logic low level. Therefore, compared with the existing manner for providing voltage sources or current sources with adjustable output capability to change the slew rate, in the slew rate control device of the present disclosure, the number of switches that are turned on in each phase interpolator can be intuitively controlled to change the slew rate.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A device, comprising:
   a signal generating circuit configured to generate a pair of differential signals including a first voltage signal and a second voltage signal that have a slew rate
   a comparator circuit configured to output an enabling signal according to a relative position between an eye crossing point of the pair of differential signals and an edge of a reference clock; and
   a control circuit coupled between the signal generating circuit and the comparator circuit and configured to generate at least one control signal according to the enabling signal for controlling the signal generating circuit which changes according to the at least one control signal the slew rate of the first voltage signal and the second voltage signal.

2. The device according to claim 1, wherein the comparator circuit includes:
   an operational amplifier configured to receive the first voltage signal and the second voltage signal and output a comparison signal; and
   a flip-flop having a data input terminal and a clock input terminal for receiving the comparison signal and the reference clock, respectively, wherein, in response to the reference clock changing from a logic low level to a logic high level, the flip-flop is configured to output an output signal that is equal to the comparison signal.

3. The device according to claim 2, wherein the comparator circuit further includes:
   an inverter coupled to the flip-flop, wherein the inverter is configured to receive and invert the output signal, and output the inverted output signal as the enabling signal.

4. The device according to claim 1, wherein the signal generating circuit includes a first phase interpolator and a second phase interpolator, wherein the first phase interpolator and the second phase are configured to output the first voltage signal and the second voltage signal through a first node and a second node, respectively, and the first phase interpolator and the second phase interpolator each include a plurality of circuit branches.

5. The device according to claim 4, wherein in the first phase interpolator or the second phase interpolator, each of the plurality of circuit branches includes a first switch, a first current source, a second current source and a second switch connected in series between a supply voltage and a ground voltage, and the first node or the second node is coupled between the first current source and the second current source.

6. The device according to claim 5, wherein the at least one control signal generated by the control circuit includes a first control signal and a second control signal, the first control signal is used to control the second switch of each of the plurality of circuit branches of the first phase interpolator and the first switch of each of the plurality of circuit branches of the second phase interpolator, and the second control signal is used to control the first switch of each of the plurality of circuit branches of the first phase interpolator and the second switch of each of the plurality of circuit branches of the second phase interpolator.

7. The device according to claim 6, wherein the control circuit is further configured to count the enabling signal to generate a count value, and to generate the first control signal and the second control signal according to the count value.

8. The device according to claim 7, wherein in the step of the control circuit being configured to count the enabling signal, in response to the control circuit determining that the enabling signal is at the logic high level, the control circuit is configured to decrement the count value by 1, and in response to the control circuit determining that the enable signal is at the logic low level, the control circuit is configured to stop counting the enabling signal.

9. A slew rate control method adapted for a slew rate control device, the slew rate control method comprising:
configuring a signal generating circuit to generate a first voltage signal and a second voltage signal having a slew rate, wherein the first voltage signal and the second voltage signal are a pair of differential signals;
configuring a comparator circuit to output an enabling signal according to a relative positional relationship between an eye crossing point of the pair of differential signals and an edge of a reference clock; and
configuring a control circuit to generate at least one control signal according to the enabling signal to control the signal generating circuit, so as to configure the signal generating circuit to, according to the at least one control signal, change the slew rate of the first voltage signal and the second voltage signal.

10. The slew rate control method according to claim 9, wherein the comparator circuit includes:
an operational amplifier configured to receive the first voltage signal and the second voltage signal and output a comparison signal; and
a flip-flop having a data input terminal and a clock input terminal for receiving the comparison signal and the reference clock, respectively, wherein, in response to the reference clock changing from a logic low level to a logic high level, the flip-flop is configured to output an output signal that is equal to the comparison signal.

11. The slew rate control method according to claim 10, wherein the comparator circuit further includes:
an inverter coupled to the flip-flop, wherein the inverter is configured to receive and invert the output signal, and output the inverted output signal as the enabling signal.

12. The slew rate control method according to claim 9, wherein the signal generating circuit includes a first phase interpolator and a second phase interpolator, wherein the first phase interpolator and the second phase are configured to output the first voltage signal and the second voltage signal through a first node and a second node, respectively, and the first phase interpolator and the second phase interpolator each include a plurality of circuit branches.

13. The slew rate control method according to claim 4, wherein in the first phase interpolator or the second phase interpolator, each of the plurality of circuit branches includes a first switch, a first current source, a second current source and a second switch connected in series between a supply voltage and a ground voltage, and the first node or the second node is coupled between the first current source and the second current source.

14. The slew rate control method according to claim 13, wherein the at least one control signal generated by the control circuit includes a first control signal and a second control signal, the first control signal is used to control the second switch of each of the plurality of circuit branches of the first phase interpolator and the first switch of each of the plurality of circuit branches of the second phase interpolator, and the second control signal is used to control the first switch of each of the plurality of circuit branches of the first phase interpolator and the second switch of each of the plurality of circuit branches of the second phase interpolator.

15. The slew rate control method according to claim 14, wherein the control circuit is further configured to count according to the enable signal to generate a count value, and the control circuit generates the first control signal and the second control signal according to the count value.

16. The slew rate control method according to claim 15, wherein in the step of the control circuit being configured to count the enabling signal, in response to the control circuit determining that the enabling signal is at the logic high level, the control circuit is configured to decrement the count value by 1, and in response to the control circuit determining that the enable signal is at the logic low level, the control circuit is configured to stop counting the enabling signal.

* * * * *